(12) United States Patent
Cheng et al.

(10) Patent No.: US 10,978,387 B2
(45) Date of Patent: Apr. 13, 2021

(54) SEMICONDUCTOR DEVICE AND METHOD FOR MANUFACTURING THE SAME

(71) Applicant: Taiwan Semiconductor Manufacturing Co., Ltd., Hsin-Chu (TW)

(72) Inventors: Chao-Yuan Cheng, Hsinchu (TW); Tien-Chien Huang, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/954,430

(22) Filed: Apr. 16, 2018

(65) Prior Publication Data
US 2018/0374793 A1   Dec. 27, 2018

Related U.S. Application Data

(60) Provisional application No. 62/510,911, filed on May 25, 2017.

(51) Int. Cl.
| | |
|---|---|
| *H01L 23/522* | (2006.01) |
| *H01L 21/768* | (2006.01) |
| *H01L 23/528* | (2006.01) |
| *H01L 23/532* | (2006.01) |

(52) U.S. Cl.
CPC .... *H01L 23/5226* (2013.01); *H01L 21/76816* (2013.01); *H01L 23/528* (2013.01); *H01L 23/5222* (2013.01); *H01L 23/5329* (2013.01); *H01L 23/53209* (2013.01); *H01L 23/53214* (2013.01); *H01L 23/53228* (2013.01); *H01L 23/53257* (2013.01); *H01L 23/53271* (2013.01)

(58) Field of Classification Search
CPC . H01L 23/481; H01L 23/5225; H01L 23/552; H01L 23/585; H01L 23/66; H01L 2224/13099; H01L 2924/00014; H01L 23/5226; H01L 21/76816; H01L 23/528
See application file for complete search history.

(56) References Cited

U.S. PATENT DOCUMENTS

| | | | | |
|---|---|---|---|---|
| 6,020,612 A * | 2/2000 | Sawamura | ............ | H01L 23/522 257/341 |
| 6,410,954 B1 * | 6/2002 | Sowlati | ............... | H01L 27/0805 257/306 |
| 6,737,698 B1 * | 5/2004 | Paul | .................... | H01L 23/5223 257/306 |
| 7,154,734 B2 * | 12/2006 | Schultz | .................... | H01G 2/22 361/306.1 |
| 7,737,020 B1 * | 6/2010 | Ho | ..................... | H01L 23/5222 438/619 |

(Continued)

*Primary Examiner* — Jarrett J Stark
(74) *Attorney, Agent, or Firm* — Duane Morris LLP

(57) ABSTRACT

A semiconductor device includes: first, second, and third tiers formed on a substrate, wherein the first tier is formed over the substrate, the second tier is formed over the first tier, and the third tier is formed over the second tier, wherein the second tier comprises a first interconnection line that is configured to transmit a signal, and wherein a portion of the first tier disposed directly under the first interconnection line of the second tier lacks any interconnection lines and a portion of the third tier disposed directly above the first interconnection line of the second tier lacks any interconnection lines.

20 Claims, 13 Drawing Sheets

(56) References Cited

U.S. PATENT DOCUMENTS

| | | | | |
|---|---|---|---|---|
| 2002/0171098 | A1* | 11/2002 | Nakaya | H01L 27/112 257/296 |
| 2004/0238950 | A1* | 12/2004 | Doan | H01L 23/5222 257/734 |
| 2007/0052062 | A1* | 3/2007 | Ding | H01L 23/5225 257/528 |
| 2007/0278551 | A1* | 12/2007 | Anthony | H01L 23/5223 257/307 |
| 2009/0001510 | A1* | 1/2009 | Matz | H01L 21/7682 257/531 |
| 2010/0127348 | A1* | 5/2010 | Quinn | H01G 4/232 257/532 |
| 2010/0264545 | A1* | 10/2010 | Collins | H01L 23/522 257/773 |
| 2011/0241160 | A1* | 10/2011 | Kerber | H01L 23/5225 257/528 |
| 2014/0375408 | A1* | 12/2014 | Yen | H01F 27/42 336/192 |
| 2017/0236778 | A1* | 8/2017 | Gonzalez Jimenez | G06F 17/5068 257/774 |

* cited by examiner

US 10,978,387 B2

SEMICONDUCTOR DEVICE AND METHOD FOR MANUFACTURING THE SAME

CROSS-REFERENCE TO RELATED APPLICATION

The present application claims priority to U.S. Provisional Patent Application No. 62/510,911, filed on May 25, 2017, which is incorporated by reference herein in its entirety.

BACKGROUND

Generally, in an integrated circuit (IC), one or more interconnection lines, each of which is formed in a respective tier, disposed over active devices of the IC are used to route signal, power, and/or ground connections to their respective desired locations, and also interconnect respective coupled active device(s) in order to form functional circuitry. As the IC has grown more powerful in accordance with a decreasing geometry size of the IC, the interconnection lines have accordingly become closer to one another. In particular, the interconnection lines in adjacent tiers, or in a same tier, typically coupled to each other via an electromagnetically coupled effect when the interconnection lines are close enough to each other, which effectively forms one or more parasitic capacitors coupled therebetween. Each of the parasitic capacitors has a respective parasitic capacitance.

Such parasitic capacitances have disadvantageously caused various issues to a corresponding IC. For example, when a critical signal (e.g., a power signal, a clock signal, etc.) is transmitted along an interconnection line of the IC, such parasitic capacitances formed between the interconnection line and one or more other interconnection lines may cause the critical signal to be untimely received by a destination node or device, i.e., a delay. In turn, overall performance of the IC may be disadvantageously affected. Thus, conventional methods for forming the interconnection lines in an IC are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIGS. 2A, 2C, 2E, 2G, and 2I illustrate top views of an exemplary semiconductor device during various fabrication stages, made by the method of FIG. 1, in accordance with some embodiments.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of a semiconductor device that includes at least an interconnection line spaced apart from other interconnection lines by at least one tier, and methods of forming the same. The term "tier" as used herein is referred to a layer, including one or more interconnection lines (or conductive segments) formed therein, at a respective level formed over a substrate of the semiconductor device. In particular, using the disclosed method to form the interconnection line, there may be no interconnection line vertically disposed above and/or below the interconnection line by at least one tier, which can substantially reduce parasitic capacitors to be formed around the interconnection line. In accordance with various embodiments of the present disclosure, such an interconnection line may be configured to transmit a critical signal (e.g., a power signal, a clock signal, etc.). As such, the above-mentioned issues existing in conventional methods to form interconnection lines can be advantageously avoided.

Figure 1:
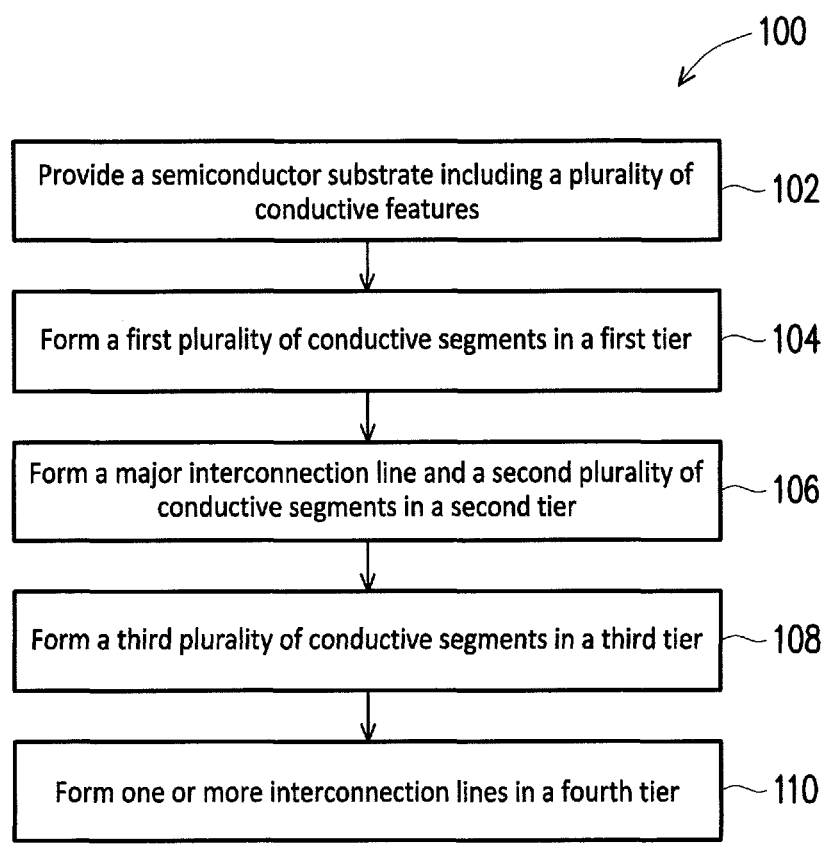
FIG. 1 illustrates a flow chart of an exemplary method for forming a semiconductor device, in accordance with some embodiments.

FIG. 1 illustrates a flowchart of a method 100 to form a semiconductor device according to one or more embodiments of the present disclosure. It is noted that the method 100 is merely an example, and is not intended to limit the present disclosure. Accordingly, it is understood that additional operations may be provided before, during, and after the method 100 of FIG. 1, and that some other operations may only be briefly described herein.

According to some embodiments, the method 100 starts with operation 102 in which a semiconductor substrate including a plurality of conductive features (e.g., a source, a drain, and/or a gate feature of a respective transistor) is provided. The method 100 continues to operation 104 in which a first plurality of conductive segments are formed in a first tier. The first tier may be formed over the semiconductor substrate. In some embodiments, each of the first plurality of conductive segments is coupled to a respective conductive feature of the semiconductor substrate through at least a via structure formed below the first tier. The method 100 continues to operation 106 in which a major interconnection line and a second plurality of conductive segments are formed in a second tier. The second tier may be disposed above the first tier. In some embodiments, the major interconnection line and the second plurality of conductive segments are each coupled to a respective one of the first plurality of conductive segments in the first tier through a via structure formed between the first and second tiers. Further, in some embodiments, the second plurality of conductive segments are each laterally spaced apart from the major interconnection line.

The method 100 continues to operation 108 in which a third plurality of conductive segments are formed in a third tier. The third tier may be disposed above the second tier. In some embodiments, the third plurality of conductive segments are each coupled to a respective one of the second plurality of conductive segments in the second tier through a via structure formed between the second and third tiers. The method 100 continues to operation 110 in which one or more interconnection lines are formed in a fourth tier. The fourth tier may be disposed above the third tier. In some embodiments, the one or more interconnection lines are each coupled to a respective one of the third plurality of conductive segments in the third tier through a via structure formed between the third and fourth tiers.

In some embodiments, operations of the method 100 may be associated with top views of the semiconductor device at various fabrication stages as shown in FIGS. 2A, 2C, 2E, 2G, and 2I, respectively, and corresponding cross-sectional views, as shown in FIGS. 2B, 2D, 2F, 2H, and 2J. The semiconductor device 200 may be included in a microprocessor, memory cell, and/or other integrated circuit (IC). Also, FIGS. 2A through 2J are simplified for a better understanding of the concepts of the present disclosure. For example, although the figures illustrate the semiconductor device 200, it is understood the IC may comprise a number of other devices such as resistors, capacitors, inductors, fuses, etc., which are not shown in FIGS. 2A-2J, for purposes of clarity of illustration.

Figure 2A:
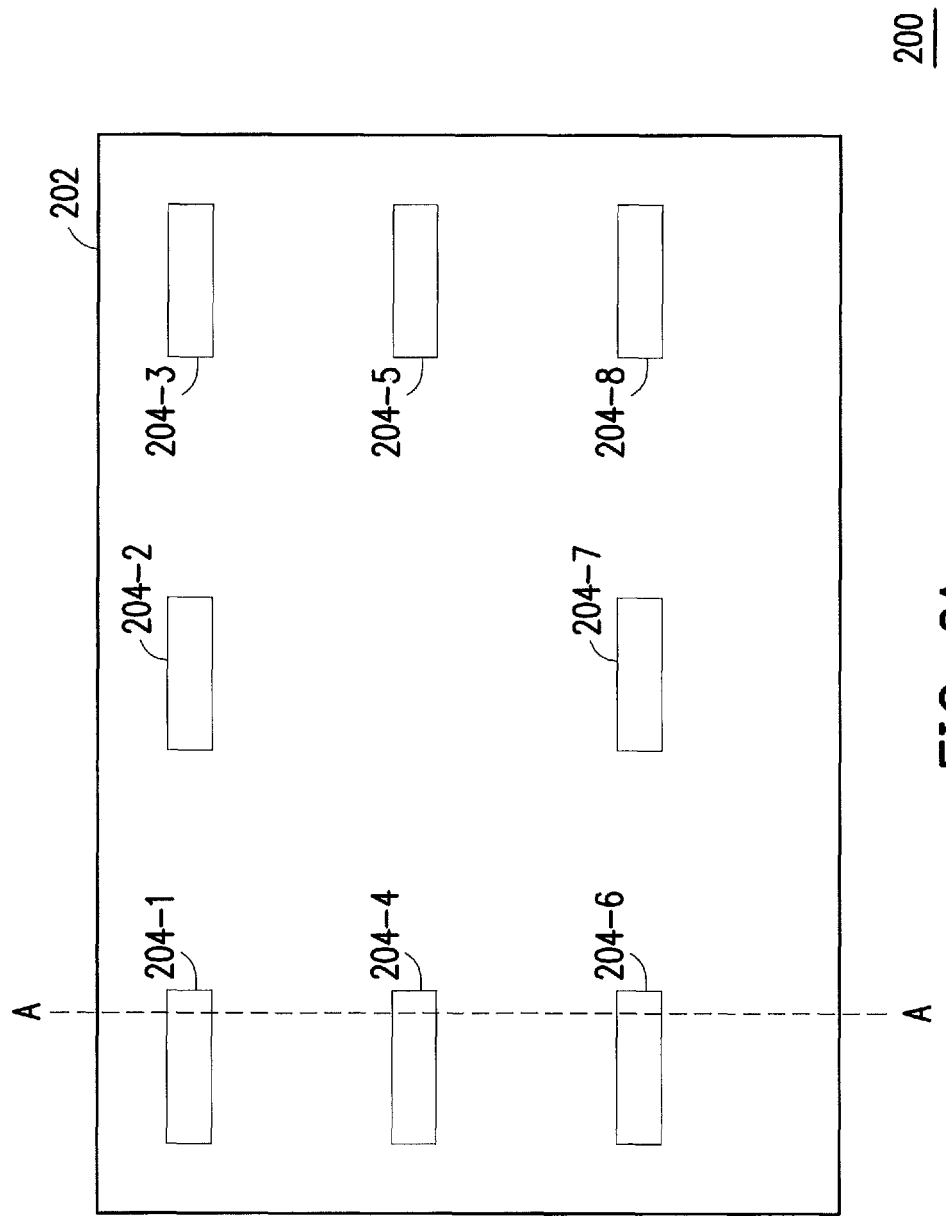
Figure 2B:
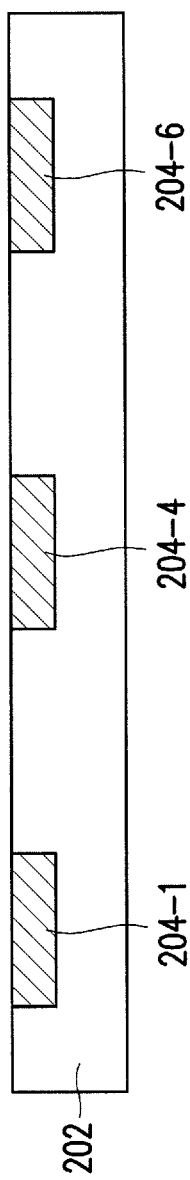
FIGS. 2B, 2D, 2F, 2H, and 2J illustrate corresponding cross-sectional views of FIGS. 2A, 2C, 2E, 2G, and 2I taken along a line, in accordance with some embodiments.

Corresponding to the operation 102 of FIG. 1, FIG. 2A is a top view of the semiconductor device 200 including a substrate 202 with a plurality of formed conductive features 204-1, 204-2, 204-3, 204-4, 204-5, 204-6, 204-7, and 204-8 at one of the various stages of fabrication, in accordance with some embodiments, and FIG. 2B is a cross-sectional view of the semiconductor device 200 taken along line A-A of FIG. 2A. Although the semiconductor device 200 in the illustrated embodiment of FIG. 2A includes 8 conductive features, it is understood that the illustrated embodiment of FIG. 2A and the following figures are merely provided for illustration purposes. Thus, the semiconductor device 200 may include any desired number of conductive features while remaining within the scope of the present disclosure.

In some embodiments, the substrate 202 includes a silicon substrate. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the substrate 202 also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 202 may further include other functional features such as a resistor or a capacitor formed in and on the substrate. The substrate 202 further include lateral isolation features provided to separate various devices formed in the substrate 202. In one embodiment, shallow trench isolation (STI) features are used for lateral isolation. The various devices further include silicide disposed on S/D, gate and other device features for reduced contact resistance when coupled to output and input signals.

In an embodiment, each of the conductive features 204-1 to 204-8 may be a source, a drain, or a gate feature of a respective transistor (e.g., a metal-oxide-semiconductor field-effect transistor (MOSFET)). For example, the conductive feature 204-1 may be a gate feature of a first MOSFET; the conductive feature 204-2 may be a gate feature of a second MOSFET; the conductive feature 204-3 may be a gate feature of a third MOSFET; the conductive feature 204-4 may be a drain feature of a fourth MOSFET; the conductive feature 204-5 may be a source feature of a fifth MOSFET; the conductive feature 204-6 may be a gate feature of a sixth MOSFET; the conductive feature 204-7 may be a gate feature of a seventh MOSFET; and the conductive feature 204-8 may be a gate feature of a eighth MOSFET, wherein the first to eighth MOSFETs may be different from or identical to one another. Alternatively, the conductive features 204-1 to 204-8 may be each a silicide feature disposed on a source, a drain, or a gate feature. The silicide feature may be formed by a self-aligned silicide (typically known as "silicide") technique. In another embodiment, the conductive features 204-1 to 204-8 may each include an electrode of a capacitor or one end of a resistor.

Figure 2C:
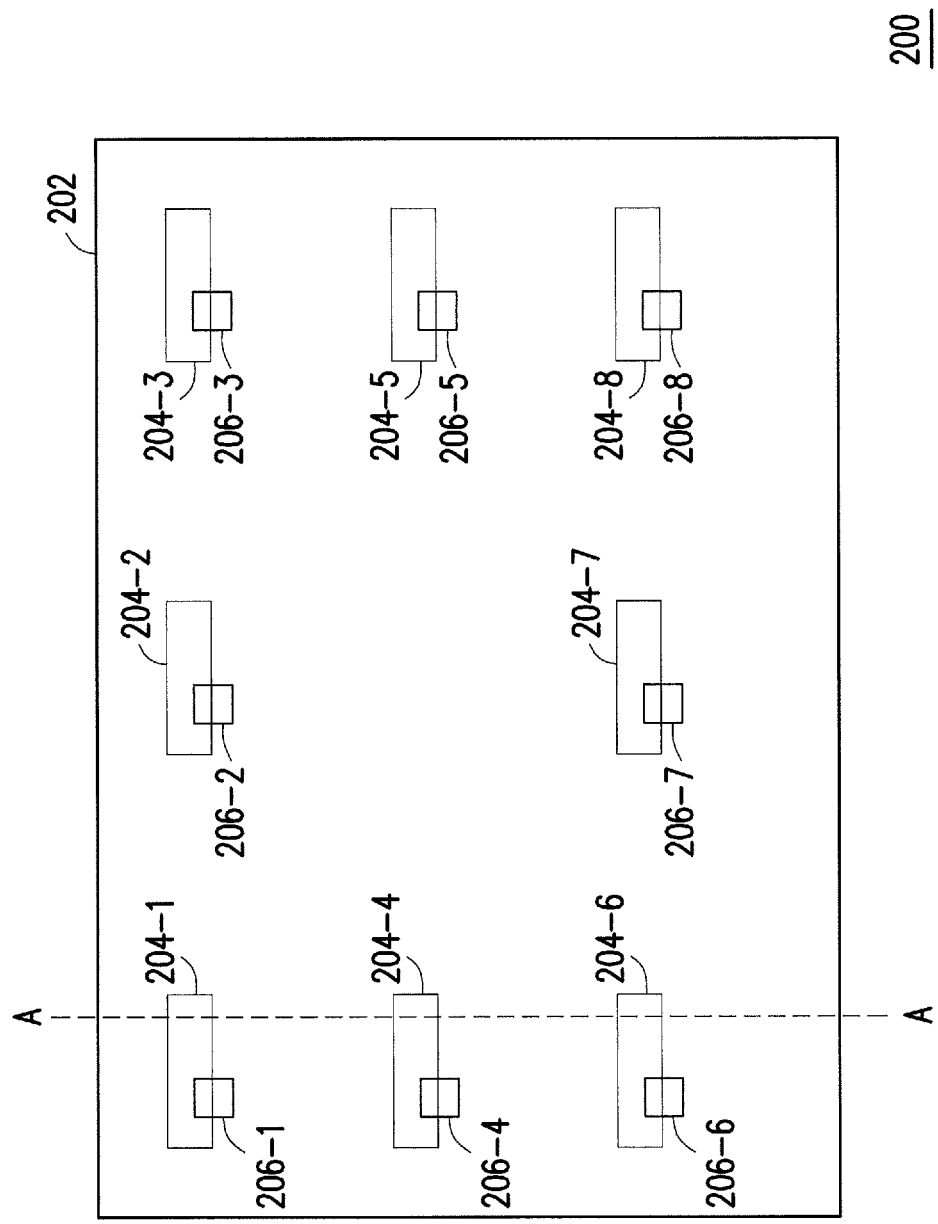
Figure 2D:
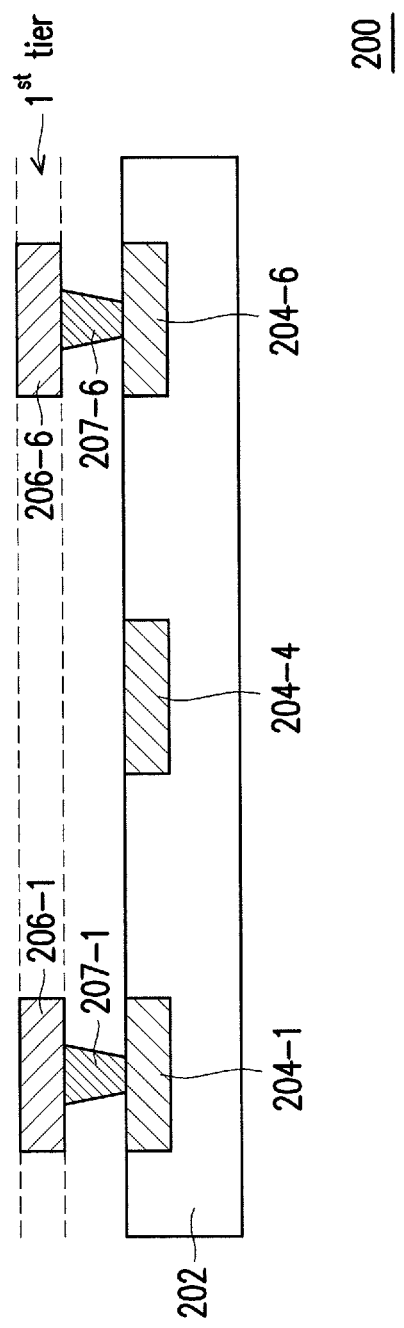

Corresponding to the operation 104 of FIG. 1, FIG. 2C is a top view of the semiconductor device 200 including a first plurality of conductive segments 206-1, 206-2, 206-3, 206-4, 206-5, 206-6, 206-7, and 206-8, which are formed in a first tier ($1^{st}$ tier), at one of the various stages of fabrication, in accordance with some embodiments, and FIG. 2D is a cross-sectional view of the semiconductor device 200 taken along line A-A of FIG. 2C. As shown in FIG. 2C, each of the first plurality of conductive segments 206-1 to 206-8 is coupled to at least one respective conductive feature (e.g., one of the conductive features 204-1 to 204-8). Although the first plurality of conductive segments 206-1 to 206-8 are shown as being displaced from respective coupled conductive features (204-1 to 204-8), it is understood that this is merely for purposes of clarity of illustration. Thus, when viewing from the top (e.g., FIG. 2C), each of the first plurality of conductive segments 206-1 to 206-8 may be partially or fully overlapped with the respective coupled conductive feature (204-1 to 204-8).

Further, in some embodiments, each of the first plurality of conductive segments 206-1 to 206-8 is coupled to the respective conductive feature (204-1 to 204-8) through a conductive structure (e.g., a via structure) formed below the first tier where the first plurality of conductive segments 206-1 to 206-8 are formed. Such via structures, e.g., 207-1, 207-6, etc., are respectively shown in the cross-sectional view of the semiconductor device 200 in FIG. 2D.

As mentioned above, the first tier is a layer (e.g., a dielectric layer) at a first level disposed above the semiconductor substrate 202, which can be better seen in the cross-sectional view of the semiconductor device 200 in FIG. 2D. In some embodiments, the first tier is formed of a dielectric material such, for example, silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. Since the dielectric material of the first tier will be used by other tiers formed subsequently, for ease of discussion, the dielectric material is herein referred to as "material D."

In some embodiments, the first plurality of conductive segments 206-1 to 206-8 each includes a metal material such as, for example, copper (Cu), tungsten (W), aluminum (Al), or a combination thereof. In some other embodiments, the first plurality of conductive segments 206-1 to 206-8 may each include other suitable metal materials (e.g., gold (Au), cobalt (Co), silver (Ag), etc.) and/or conductive materials (e.g., polysilicon) while remaining within the scope of the present disclosure. Similarly, since the material of the first plurality of conductive segments 206-1 to 206-8 will be used by other conductive structures (e.g., conductive segments, interconnection lines, etc.) formed subsequently, for ease of discussion, the material is herein referred to as "material M."

In some embodiments, the first plurality of conductive segments 206-1 to 206-8 may be formed by at least some of the following processes: using chemical vapor deposition (CVD), physical vapor deposition (PVD), spin-on coating, and/or other suitable techniques to deposit the material D over the substrate 202 with an initial dielectric layer, including the above-mentioned via structures, formed therebetween; performing one or more patterning processes (e.g., a lithography process, a dry/wet etching process, a cleaning process, a soft/hard baking process, etc.) to form a plurality of openings through the material D, wherein each of the plurality of openings is aligned with a respective conductive feature (204-1 to 204-8); using CVD, PVD, E-gun, and/or other suitable techniques to fill the plurality of openings with the material M; and polishing out excessive material M to form the first plurality of conductive segments 206-1 to 206-8 in the first tier.

Figure 2E:
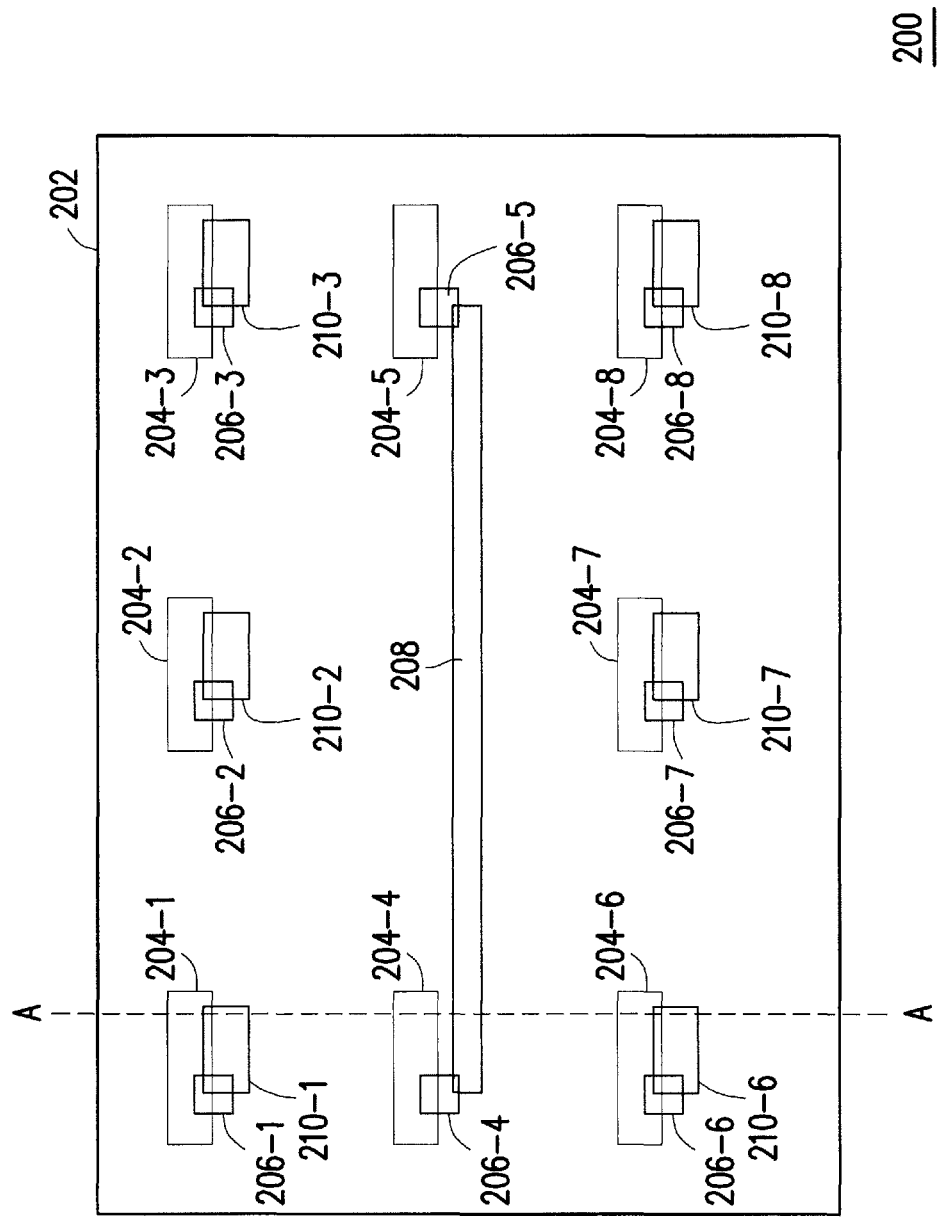
Figure 2F:
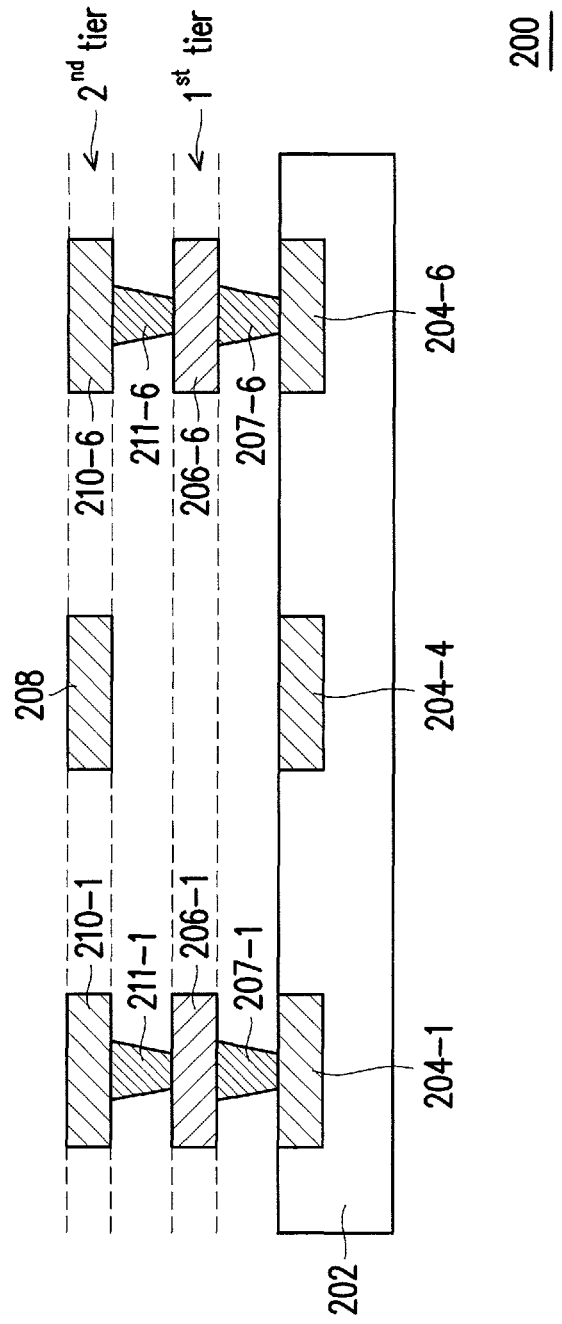

Corresponding to the operation 106 of FIG. 1, FIG. 2E is a top view of the semiconductor device 200 including a major interconnection line 208 and a second plurality of conductive segments 210-1, 210-2, 210-3, 210-6, 210-7, and 210-8, which are formed in a second tier ($2^{nd}$ tier) above the first tier, at one of the various stages of fabrication, in accordance with some embodiments, and FIG. 2F is a cross-sectional view of the semiconductor device 200 taken along line A-A of FIG. 2E. As shown in FIG. 2E, the major interconnection line 208 is laterally spaced from the second plurality of conductive segments 210-1 to 210-8, and coupled to the conductive features 204-4 and 204-5 through the conductive segments 206-4 and 206-5 in the first tier, respectively. In some embodiments, the major interconnection line 208 is configured to transmit one of various critical signals, as mentioned above, and accordingly, such a critical signal may be transmitted from the conductive features 204-4 to 204-5, or the other way around.

Similar to first plurality of conductive segments 206-1 to 206-8 in the first tier, each of the second plurality of conductive segments 210-1 to 210-8 is coupled to at least one respective conductive segment (e.g., one of the conductive segments 206-1 to 206-8) in the first tier. Although the second plurality of conductive segments 210-1 to 210-8 in the second tier are shown as being displaced from the respective coupled conductive segments (e.g., 206-1 to 206-8) in the first tier, it is understood that this is merely for purposes of clarity of illustration. Thus, when viewing from the top, each of the second plurality of conductive segments 210-1 to 210-8 may be partially or fully overlapped with the respective coupled conductive segment (e.g., one of 206-1 to 206-8) in the first tier.

Further, in some embodiments, each of the second plurality of conductive segments 210-1 to 210-8 in the second tier is coupled to the respective conductive segment (e.g., one of 206-1 to 206-8) in the first tier through a conductive structure (e.g., a via structure) formed below the second tier where the second plurality of conductive segments 210-1 to 210-8 are formed. Such via structures, e.g., 211-1, 211-6, etc., are shown in the cross-sectional view of the semiconductor device 200 of FIG. 2F.

In some embodiments, the second tier is formed of the material D, and the major interconnection line 208 and the second plurality of conductive segments 210-1 to 210-8 are each formed of the material M. In some embodiments, the major interconnection line 208 and the second plurality of conductive segments 210-1 to 210-8 may be formed by at least some of the following processes: using chemical vapor deposition (CVD), physical vapor deposition (PVD), spin-on coating, and/or other suitable techniques to deposit the material D over the first tier with a dielectric layer, including the above-mentioned via structures, formed therebetween; performing one or more patterning processes (e.g., a lithography process, a dry/wet etching process, a cleaning process, a soft/hard baking process, etc.) to form a plurality of openings through the material D, wherein the major interconnection line 208 is aligned with respect to the conducive segments 206-4 and 206-5 in the first tier and each of the plurality of openings is aligned with a respective conductive segment (206-1 to 206-8) in the first tier; using CVD, PVD, E-gun, and/or other suitable techniques to fill the plurality of openings with the material M; and polishing out excessive material M to form the major interconnection line 208 and the second plurality of conductive segments 210-1 to 210-8 in the second tier.

Figure 2G:
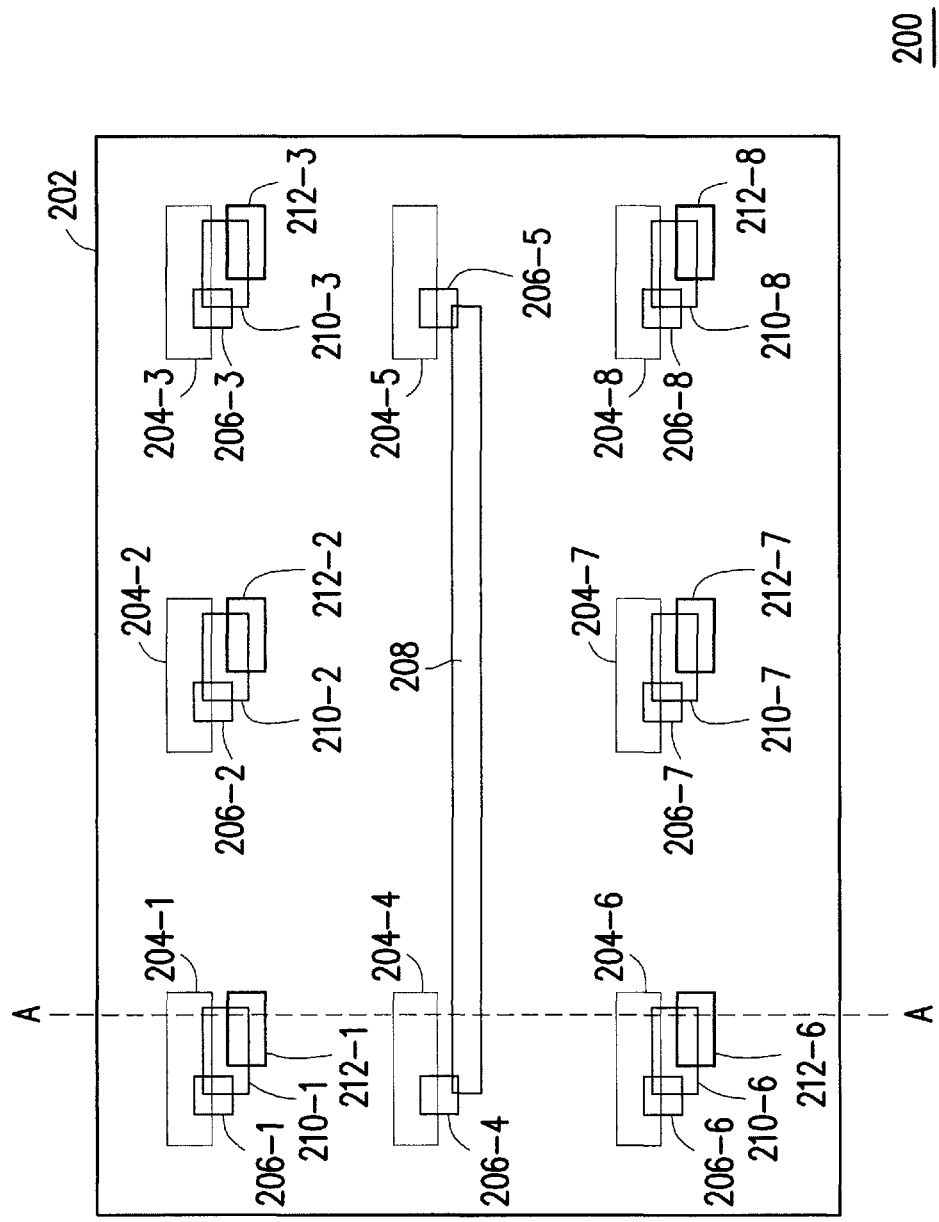
Figure 2H:
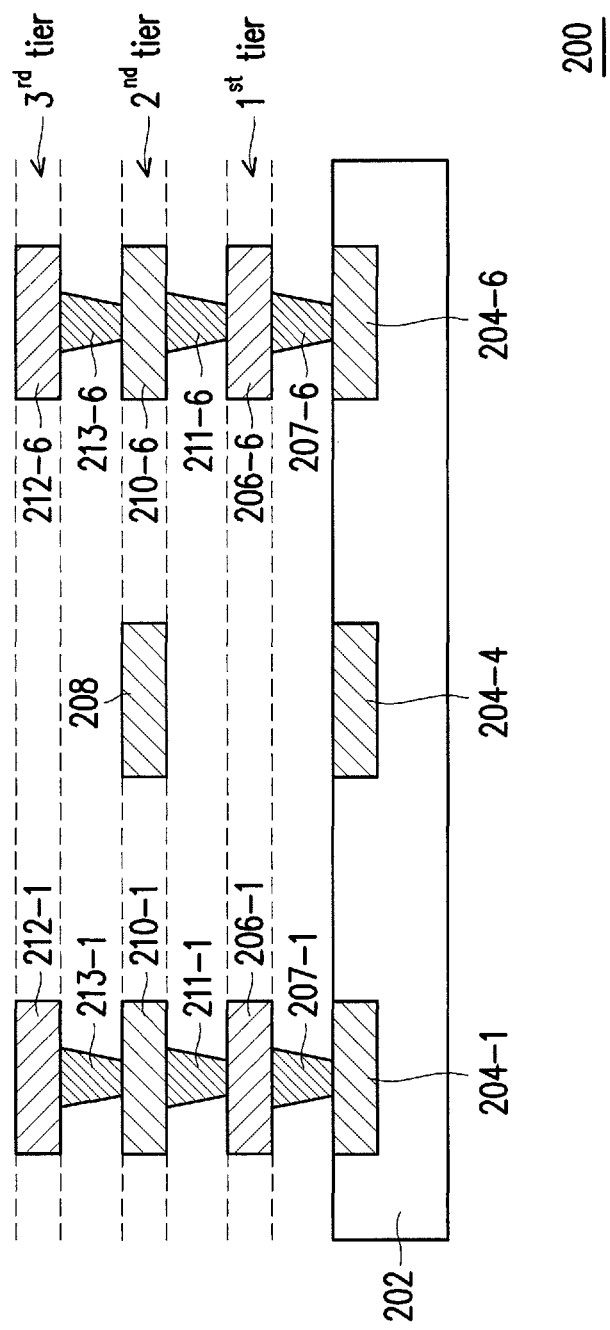
Figure 21:
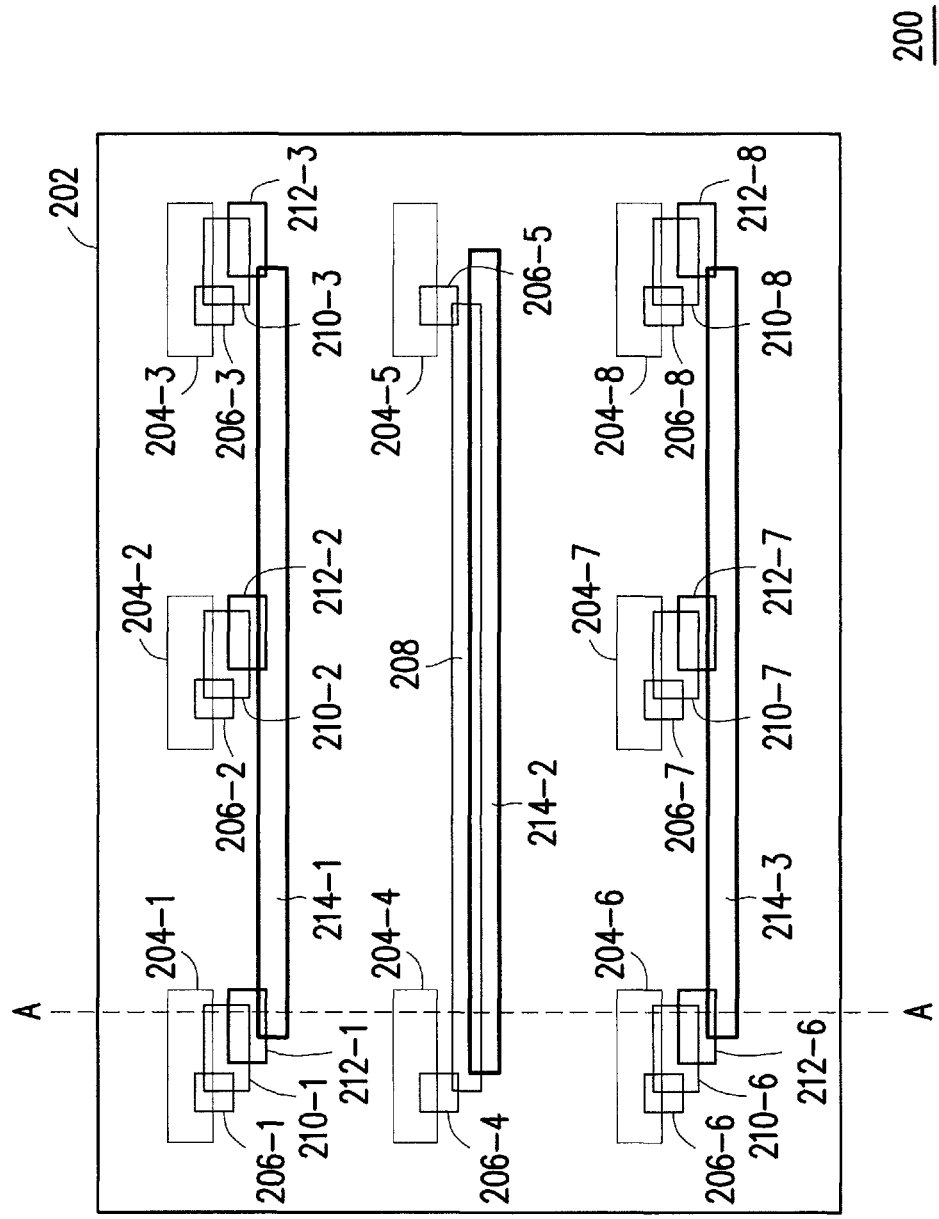

Corresponding to the operation 108 of FIG. 1, FIG. 2G is a top view of the semiconductor device 200 including a third plurality of conductive segments 212-1, 212-2, 212-3, 212-6, 212-7, and 212-8, which are formed in a third tier ($3^{rd}$ tier) above the second tier, at one of the various stages of fabrication, in accordance with some embodiments, and FIG. 2H is a cross-sectional view of the semiconductor device 200 taken along line A-A of FIG. 2G. Similar to the above-described conductive segments 210-1 to 210-8 formed in the second tier, each of the third plurality of conductive segments 212-1 to 212-8 is coupled to at least one respective conductive segment (e.g., one of 210-1 to 210-8) in the second tier. Although the third plurality of conductive segments 212-1 to 212-8 are shown as being displaced from the respective coupled conductive segments (e.g., 210-1 to 210-8) in the second tier, it is understood that this is merely for purposes of clarity of illustration. Thus, when viewing from the top, each of the third plurality of conductive segments 212-1 to 212-8 may be partially or fully overlapped with the respective coupled conductive segment (e.g., one of 210-1 to 210-8) in the second tier.

Further, in some embodiments, each of the third plurality of conductive segments 212-1 to 212-8 in the third tier is coupled to the respective conductive segment (e.g., one of 210-1 to 210-8) in the second tier through a conductive structure (e.g., a via structure) formed below the third tier where the second plurality of conductive segments 210-1 to 210-8 are formed. Such via structures, e.g., 213-1, 213-6, etc., are shown in the cross-sectional view of the semiconductor device 200 of FIG. 2H.

In some embodiments, the third tier is formed of the material D, and the third plurality of conductive segments 212-1 to 212-8 are each formed of the material M. In some embodiments, the third plurality of conductive segments 212-1 to 212-8 may be formed by at least some of the following processes: using chemical vapor deposition (CVD), physical vapor deposition (PVD), spin-on coating, and/or other suitable techniques to deposit the material D over the second tier with a dielectric layer, including the above-mentioned via structures, formed therebetween; performing one or more patterning processes (e.g., a lithography process, a dry/wet etching process, a cleaning process, a soft/hard baking process, etc.) to form a plurality of openings through the material D, wherein each of the plurality of openings is aligned with a respective conductive segment (210-1 to 210-8) in the second tier; using CVD, PVD, E-gun, and/or other suitable techniques to fill the plurality of openings with the material M; and polishing out excessive material M to form the third plurality of conductive segments 212-1 to 212-8 in the third tier.

Figure 2J:
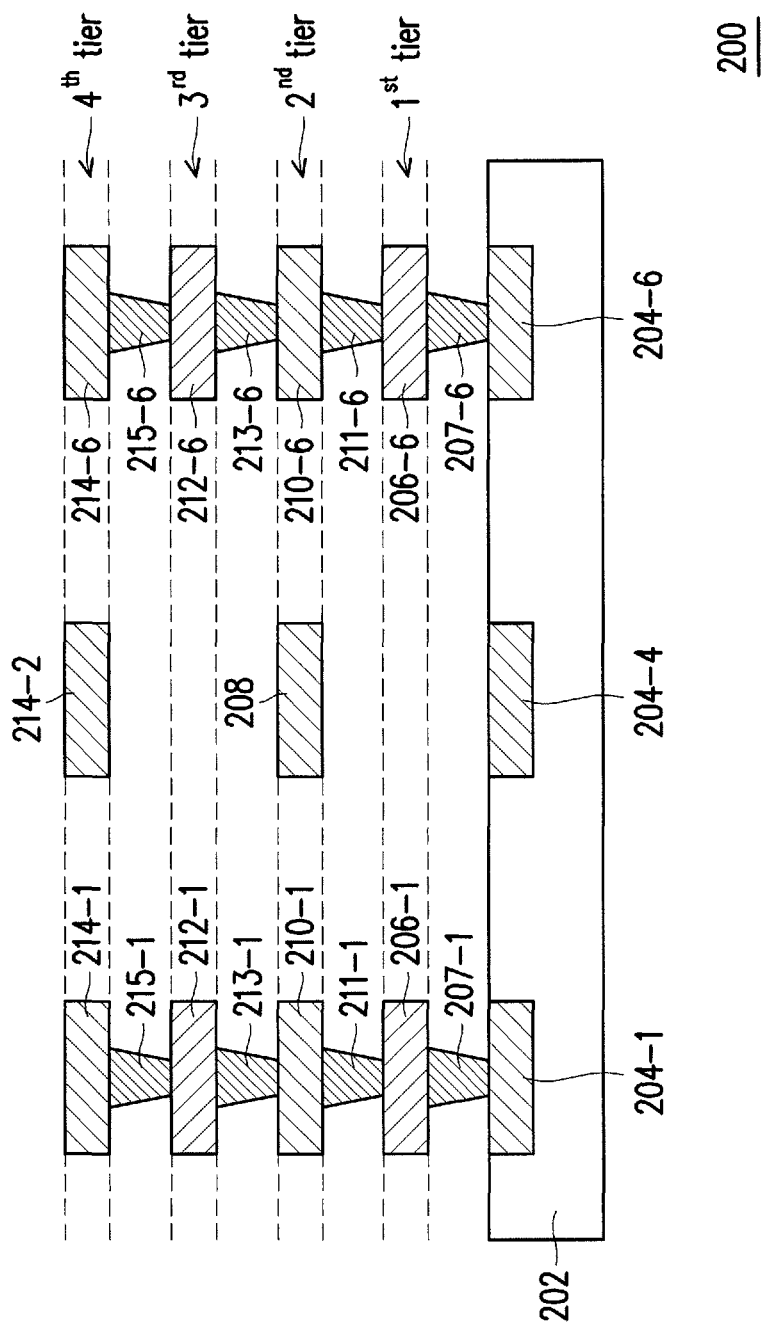

Corresponding to the operation 110 of FIG. 1, FIG. 2I is a top view of the semiconductor device 200 including additional interconnection lines 214-1, 214-2, and 214-3, which are formed in a fourth tier (4$^{th}$ tier) above the third tier, at one of the various stages of fabrication, in accordance with some embodiments, and FIG. 2J is a cross-sectional view of the semiconductor device 200 taken along line A-A of FIG. 2I. As shown in FIG. 2I, the interconnection lines 214-1 in the fourth tier is coupled to the conductive segments 212-1, 212-2, and 212-3 in the third tier; the interconnection lines 214-2 in the fourth tier is formed above the major interconnection line 208 in the second tier with at least one tier (e.g., the third tier) disposed therebetween, which will be discussed below; and the interconnection lines 214-3 in the fourth tier is coupled to the conductive segments 212-6, 212-7, and 212-8 in the third tier.

In some embodiments, each of the interconnection lines 214-1, 214-2, and 214-3 is configured to transmit one of various critical signals, as mentioned above, and coupled to at least two respective conductive features of 204-1 to 204-8. For example, the interconnection line 214-1 is coupled to the conductive features 204-1, 204-2, and 204-3; the interconnection line 214-2 is coupled to the conductive features 204-4 and 204-5; and the interconnection line 214-3 is coupled to the conductive features 204-6, 204-7, and 204-8. Accordingly, a respective critical signal may be transmitted between the conductive features 204-1, 204-2, and 204-3; a respective critical signal may be transmitted between the conductive features 204-4 and 204-5; and a respective critical signal may be transmitted between the conductive features 204-6, 204-7, and 204-8.

Similarly, although the interconnection lines 214-1 and 214-3 are shown as being displaced from the respective coupled conductive segments (e.g., 212-1 to 212-8) in the third tier, it is, understood that this is merely for purposes of clarity of illustration. Thus, when viewing from the top, the conductive segment (e.g., one or more of 212-1 to 212-8) in the third tier may be partially or fully overlapped with respective coupled interconnection lines 214-1 and 214-3. Further, in some embodiments, each of the interconnection lines 214-1 and 214-3 is coupled to the respective conductive segment(s) (e.g., 212-1 to 212-8) in the third tier through a conductive structure (e.g., a via structure) 215-1 and 215-6 formed below the fourth tier where the interconnection lines 214-1 to 214-3 are formed, which are shown in the cross-sectional view of the semiconductor device 200 of FIG. 2J. Although not shown in FIG. 2J, in some embodiments, the interconnection line 214-2 may be coupled to the major interconnection line 208 through one or more via structures, substantially similar to the via structure 215- and 215-6.

In some embodiments, the fourth tier is formed of the material D, and the interconnection lines 214-1 to 214-3 are each formed of the material M. In some embodiments, the interconnection lines 214-1 to 214-3 may be formed by at least some of the following processes: using chemical vapor deposition (CVD), physical vapor deposition (PVD), spin-on coating, and/or other suitable techniques to deposit the material D over the third tier with a dielectric layer, including the above-mentioned via structures, formed therebetween; performing one or more patterning processes (e.g., a lithography process, a dry/wet etching process, a cleaning process, a soft/hard baking process, etc.) to form a plurality of openings through the material D, wherein the interconnection lines 214-1 and 214-3 are each aligned with respect to the respective conducive segments (e.g., 212-1 to 212-8) in the third tier and the interconnection line 214-2 is aligned with respect to the major interconnection line 208 in the second tier; using CVD, PVD, E-gun, and/or other suitable techniques to fill the plurality of openings with the material M; and polishing out excessive material M to form the interconnection lines 214-1 to 214-3 in the fourth tier.

It is understood by persons of ordinary skill in the art that about 10 tiers, each of which is substantially similar to the above-discussed first, second, third, and fourth tiers, are typically formed above a semiconductor substrate (e.g., 202). Referring again to the cross-sectional view of the semiconductor device 200 of FIG. 2J, although the major interconnection line 208 is vertically spaced from a next adjacent interconnection line (e.g., 214-2) by one tier (e.g., the third tier), it is noted that, by using the exemplary method 100 of FIG. 1 to make the semiconductor device 200, the major interconnection line 208 can located in any of the 10 tiers. Accordingly, in some other embodiments, the major interconnection line 208 may be vertically spaced from a next adjacent interconnection line, disposed above or below the major interconnection line 208, by one or more tiers.

As mentioned above, the conventional methods for forming the interconnection lines in the IC typically cause a major interconnection line to be electromagnetically coupled by one or more other interconnection lines that are disposed in a same tier as a respective tier in which the major interconnection line is disposed (a "major tier") and/or adjacent tier(s) to the major tier. Such couplings from the other interconnection lines disadvantageously induce undesirable (e.g., too large to be ignored) parasitic capacitances formed around the major interconnection line. In general, an amount of such parasitic capacitances is determined by how much "electromagnetically couple-able portion" and/or how much "electromagnetically couple-able distance" present between the major interconnection line and the other interconnection lines/conductive features.

Figure 3A:
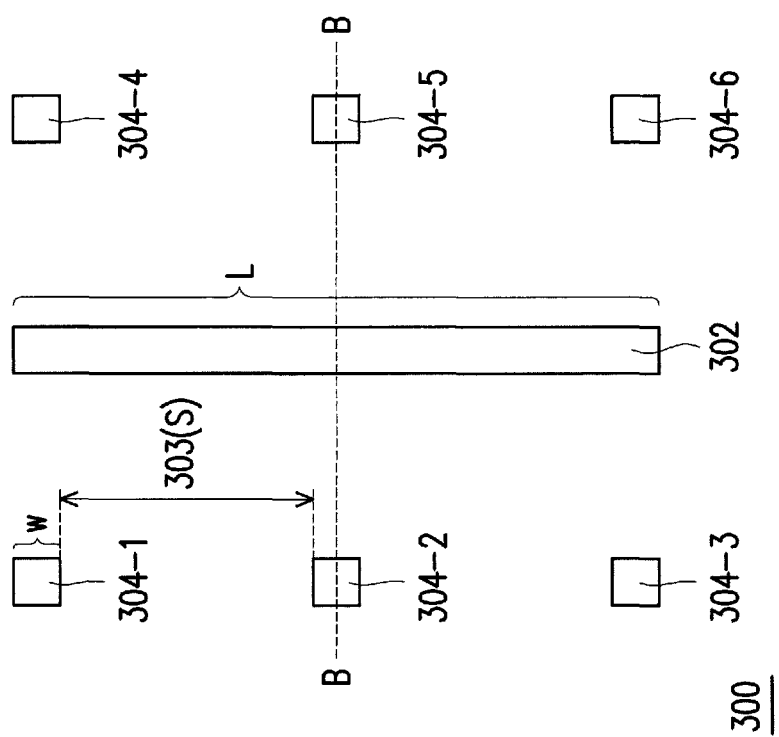
FIG. 3A illustrates a top view of an exemplary semiconductor device, made by the method of FIG. 1, in accordance with some embodiments.
Figure 3B:
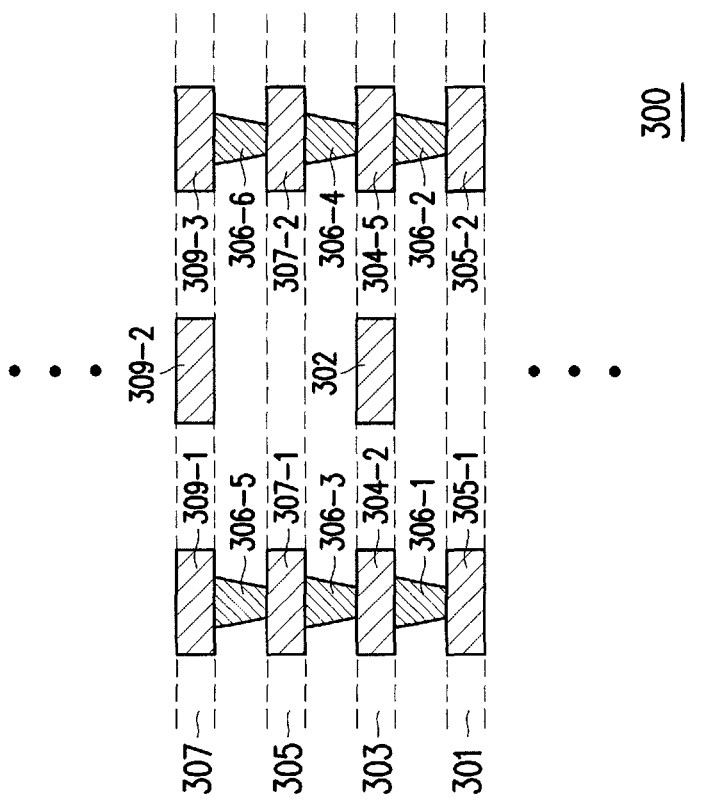
FIG. 3B illustrates a corresponding cross-sectional view of FIG. 3A, in accordance with some embodiments.

FIG. 3A illustrates top views of an exemplary semiconductor device 300 made by the method 100 of FIG. 1 to form interconnection lines; and FIG. 3B illustrates respective cross-sectional views of the exemplary semiconductor device 300, along line B-B, in accordance with various embodiments of the present disclosure.

Referring first to the top view of FIG. 3A, the semiconductor device 300, made by the method 100 of FIG. 1, includes a major interconnection line 302 formed in a major tier, and within the major tier, a plurality of conductive segments 304-1, 304-2, 304-3, 304-4, 304-5, and 304-6 are laterally spaced from the major interconnection line 302.

In comparison with the semiconductor device made by existing methods (hereinafter "existing semiconductor device"), the electromagnetically couple-able portions in the semiconductor device 300 between the major interconnection line 302 and the conductive segments 304-1, 304-2, 304-3, 304-4, 304-5, and 304-6, within a same tier, are relatively smaller since the existing semiconductor device typically requires one or more interconnection lines to be formed in parallel with a major interconnection line. In an example where the major interconnection lines 302 and 322 and the other interconnection lines 324 and 326 have a same length "L," the conductive segments 304-1 to 304-6 have a same length "w," and w is substantially smaller than L, the electromagnetically couple-able portions in the semiconductor device 300 between the major interconnection line 302 and the conductive segments 304-1 to 304-6, within a same tier, may be about 6 w while the electromagnetically couple-able portions in the existing semiconductor device between the major interconnection line and one of other interconnection lines, within a same tier, may be at least 2 L. Since, as mentioned above, w is selected to be substantially smaller than L, the electromagnetically couple-able portions in the semiconductor device 300 are substantially smaller than the ones in the existing semiconductor device, which significantly reduces an amount of parasitic capacitances around the major interconnection line 302.

Referring then to the cross-sectional of FIG. 3B, the semiconductor device 300, made by the method 100 of FIG. 1, further includes a plurality of conductive segments 305-1 and 305-2 in tier 301 that is one tier below tier 303 (i.e., the major tier where the major interconnection line 302 is formed), 307-1 and 307-2 in tier 305 that is one tier above the major tier 303, and 309-1 and 309-3 in tier 307 that is two tiers above the major tier 303. In some embodiments, the semiconductor device 300 may further include an interconnection line 309-2 in the tier 307. As mentioned above, one or more via structures (e.g., 306-1, 306-2, 306-3, 306-4, 306-5 and 306-6 in the semiconductor device 300) are disposed between two adjacent tiers to couple respective conductive segments/interconnection lines.

In comparison, the electromagnetically couple-able distance in the semiconductor device 300 between the major interconnection line 302 and other interconnection lines (e.g., 309-2), across plural tiers, are substantially greater than the ones in the existing semiconductor device because in the semiconductor device 300, plural tiers are disposed between the major tier 303 and another tier where a next adjacent interconnection line is formed. As known by persons of ordinary skill in the art, a capacitance is inversely proportional to a respective electromagnetically couple-able distance. Thus, the amount of parasitic capacitances around the major interconnection line 302, caused by other interconnection lines across different tiers, can be substantially reduced.

In an embodiment, a semiconductor device includes: first, second, and third tiers formed on a substrate, wherein the first tier is formed over the substrate, the second tier is formed over the first tier, and the third tier is formed over the second tier, wherein the second tier comprises a first interconnection line that is configured to transmit a signal, and wherein a portion of the first tier disposed directly under the first interconnection line of the second tier lacks any interconnection lines and a portion of the third tier disposed directly above the first interconnection line of the second tier lacks any interconnection lines.

In another embodiment, a semiconductor device includes: a plurality of tiers formed on a substrate, wherein a first one of the plurality of tiers comprises a first interconnection line that is configured to transmit a first signal, and a second one of the plurality of tiers comprises a second interconnection line that is configured to transmit a second signal, and wherein the first and second tiers are vertically spaced from each other by at least one of the plurality of tiers.

Yet in another embodiment, a semiconductor device includes: providing a semiconductor substrate comprising a plurality of conductive features formed thereon; forming a first plurality of conductive segments in a first tier over the semiconductor substrate, wherein the first plurality of conductive segments are respectively coupled to a first subset of the plurality of conductive features; and forming a major interconnection line, laterally spaced apart from the first plurality of conductive segments, in a second tier over the first tier, wherein the major interconnection line is coupled to a second subset of the plurality of conductive features.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   first, second, and third tiers formed on a substrate,
   wherein the first tier is formed over the substrate, the second tier is formed over the first tier, and the third tier is formed over the second tier,
   wherein the second tier comprises a first interconnection line that is configured to transmit a signal between a first conductive segment located at a first end portion of the second tier and a second conductive segment located at a second end portion of the second tier, the second end portion being opposite the first end portion, wherein the second tier further comprises a plurality of third conductive segments laterally offset from a first side of the first interconnection line and plurality of fourth conductive segments laterally offset from a second side of the first interconnection line opposite the first side, wherein lengths of the plurality of third and fourth conductive segments are substantially smaller than a length of the first interconnection line, and
   wherein the first tier does not contain any interconnection lines or conductive segments disposed directly under the first interconnection line of the second tier between the first and second conductive segments, and the third tier does not contain any interconnection lines or conductive segments disposed directly above the first interconnection line of the second tier between the first and second conductive segments.

2. The device of claim 1, wherein the first interconnection line is coupled to at least two conductive features formed over the substrate.

3. The device of claim 2, wherein the at least two conductive features are configured to transmit a signal therebetween.

4. The device of claim 1, wherein the first tier comprises a plurality of conductive segments that are each laterally spaced apart from the portion of the first tier disposed directly under the first interconnection line of the second tier.

5. The device of claim 1, wherein the third tier comprises a plurality of conductive segments that are each laterally spaced apart from the portion of the third tier disposed directly above the first interconnection line of the second tier.

6. The device of claim 1, wherein the second tier further comprises a plurality of conductive segments that are each laterally spaced apart from the first interconnection line on opposite sides of the first interconnection line as it extends between the first and second conductive segments.

7. The device of claim 1, further comprising:
a fourth tier formed over the third tier, wherein the fourth tier comprises a second interconnection line configured to transmit a respective signal.

8. The device of claim 7, wherein the portion of the third tier disposed directly above the first interconnection line of the second tier is disposed below the second interconnection line.

9. The device of claim 7, wherein each of the first, second, third, and fourth tiers includes a dielectric material.

10. A semiconductor device, comprising:
a plurality of tiers formed on a substrate,
wherein a first tier of the plurality of tiers comprises a first interconnection line that is configured to transmit a first signal between first and second conductive segments located at opposite end portions of the first tier, and a second tier of the plurality of tiers comprises a second interconnection line that is configured to transmit a second signal between third and fourth conductive segments located at opposite end portions of the second tier, wherein the second tier further comprises a plurality of fifth conductive segments laterally offset from a first side of the second interconnection line and plurality of sixth conductive segments laterally offset from a second side of the second interconnection line opposite the first side, wherein lengths of the plurality of fifth and sixth conductive segments are substantially smaller than a length of the second interconnection line,
wherein the first and second tiers are vertically spaced from each other by at least one of the plurality of tiers that each includes a portion directly disposed between the first and second interconnection lines and extending a length of the first and second interconnection lines between the first and second conductive segments of the first tier and between the third and fourth conductive segments of the second tier, respectively, and
wherein each of the at least one of the plurality of tiers located between the first and second tiers, lacks any interconnection lines or conductive segments directly between the first and second interconnection lines and extending the length of the first and second interconnection lines between the first and second conductive segments and between the third and fourth conductive segments, respectively.

11. The device of claim 10, wherein the first tier comprises a plurality of conductive segments that are each laterally spaced apart from the first interconnection line.

12. The device of claim 10, wherein the second tier comprises a plurality of conductive segments that are each laterally spaced apart from the second interconnection line.

13. The device of claim 10, wherein at least one of the plurality of tiers each comprises a plurality of conductive segments that are laterally spaced apart from the first and second interconnection lines.

14. The device of claim 13, wherein each of the plurality of conductive segments has a length that is substantially shorter than a length of either the first or the second interconnection line.

15. The device of claim 10, wherein each of the plurality of tiers includes a dielectric material.

16. The device of claim 10, wherein the first interconnection line is coupled to first and second conductive features formed over the substrate, and the second interconnection line is coupled to third and fourth conductive features formed over the substrate.

17. The device of claim 16, wherein the first and second conductive features are configured to transmit the first signal therebetween, and the third and fourth conductive features are configured to transmit the second signal therebetween.

18. A method, comprising:
providing a semiconductor substrate comprising a plurality of conductive features formed thereon;
forming a first plurality of conductive segments in a first tier over the semiconductor substrate, wherein the first plurality of conductive segments are respectively coupled to a first subset of the plurality of conductive features; and
forming a major interconnection line that is configured to transmit a signal, laterally spaced apart from the first plurality of conductive segments, in a second tier over the first tier, wherein the major interconnection line is configured to transmit the signal between a first conductive segment located at a first end portion of the second tier and a second conductive segment located at a second end portion of the second tier, the second end portion being opposite the first end portion, wherein the second tier further comprises a plurality of third conductive segments laterally offset from a first side of the major interconnection line and plurality of fourth conductive segments laterally offset from a second side of the major interconnection line opposite the first side, wherein lengths of the plurality of third and fourth conductive segments are substantially smaller than a length of the first interconnection line, and
wherein the major interconnection line is coupled to a second subset of the plurality of conductive features, and wherein the first tier lacks any interconnection lines or conductive segments disposed directly under the major interconnection line of the second tier between the first and second conductive segments.

19. The method of claim 18, further comprising:
forming a second plurality of conductive segments in a third tier over the second tier, wherein the second plurality of conductive segments are each laterally spaced apart from the major interconnection line.

20. The method of claim 19, wherein a portion of the third tier disposed directly above the major interconnection line of the second tier lacks any interconnection lines.

* * * * *